United States Patent
Hamlin et al.

[11] Patent Number: 5,707,241
[45] Date of Patent: Jan. 13, 1998

[54] SLIDE LOCKING CONNECTOR

[75] Inventors: Gary Joe Hamlin, Windham; Steven Arthur Musick, Burton, both of Ohio

[73] Assignee: General Motors Corporation, Detroit, Mich.

[21] Appl. No.: 674,296

[22] Filed: Jul. 1, 1996

[51] Int. Cl.$^6$ ........................................... H01R 9/09
[52] U.S. Cl. ....................... 439/67; 439/329; 439/545
[58] Field of Search ........................ 439/67, 493, 329, 439/545

[56] References Cited

U.S. PATENT DOCUMENTS

| | | | |
|---|---|---|---|
| 5,240,420 | 8/1993 | Roberts | 439/62 |
| 5,295,838 | 3/1994 | Walen et al. | 439/67 |

*Primary Examiner*—Neil Abrams
*Assistant Examiner*—T. C. Patel
*Attorney, Agent, or Firm*—Cary W. Brooks

[57] ABSTRACT

Generally, the invention includes a connector system for making an electrical connection between a flexible circuit and a printed circuit board. The printed circuit board or semi-conductor device has contact pads for mating with the electrical traces of the flexible circuit. A mounting bar is provided and a leaf spring(s) secured thereto. The electrical traces of the flexible circuit that are aligned and overlie the leaf spring(s). Posts extend upward from the mounting bar, and the printed circuit board has slotted through holes formed therein for receiving the post. The posts of the mounting bar are inserted into the printed circuit board through holes and force is applied to the mounting bar to compress the spring(s). The flexible circuit/mounting bar assembly is then slid into the slots of the printed circuit board causing the flexible circuits contacts to wipe and come to rest in alignment with the printed circuit board contact pads.

5 Claims, 2 Drawing Sheets

SLIDE LOCKING CONNECTOR

FIELD OF THE INVENTION

This invention relates to electrical connectors, and more particularly, to a connector for making electrical connection between a flexible circuit and a printed circuit board.

BACKGROUND OF THE INVENTION

A variety of electrical connectors are known for making connections between a flexible circuit and another device such as a printed circuit board. Walen et al, U.S. Pat. No. 5,295,838 discloses such a system. Walen et al describes a system including a rigid circuit board having contact pads defined thereon and a flexible circuit having raised features extending above a flat surface of the flexible circuit. The raised features are aligned for mating with the contact pads on the printed circuit board. An elongated pressure bar overlies the flexible circuit in the area where the raised features are located. The pressure bar has a plurality of holes formed therein and a coil spring is received in each hole and are aligned to match the location of the raised features on the flexible circuit. A clamping bar overlies the pressure bar and is secured to the circuit board by screws extending through the clamping bar and into the circuit board. This system has numerous parts that require a substantial amount of cost and labor to assemble.

The present invention provides advantages and alternatives over the prior art.

SUMMARY OF THE INVENTION

Generally, the invention includes a connector system for making an electrical connection between a flexible circuit and a printed circuit board. The printed circuit board or semi-conductor device has contact pads for mating with the electrical traces of the flexible circuit. A mounting bar is provided and a leaf spring(s) secured thereto. The electrical traces of the flexible circuit that are aligned and overlie the leaf spring(s). Posts extend upward from the mounting bar, and the printed circuit board has slotted through holes formed therein for receiving the post. The posts of the mounting bar are inserted into the printed circuit board through holes and force is applied to the mounting bar to compress the spring(s). The flexible circuit/mounting bar assembly is then slid into the slots of the printed circuit board causing the flexible circuits contacts to wipe and come to rest in alignment with the printed circuit board contact pads.

These and other objects, features and advantages of the present invention will become apparent from the following brief description of the drawings, detailed description and appended claims and drawings.

DETAILED DESCRIPTION

Figure 1:
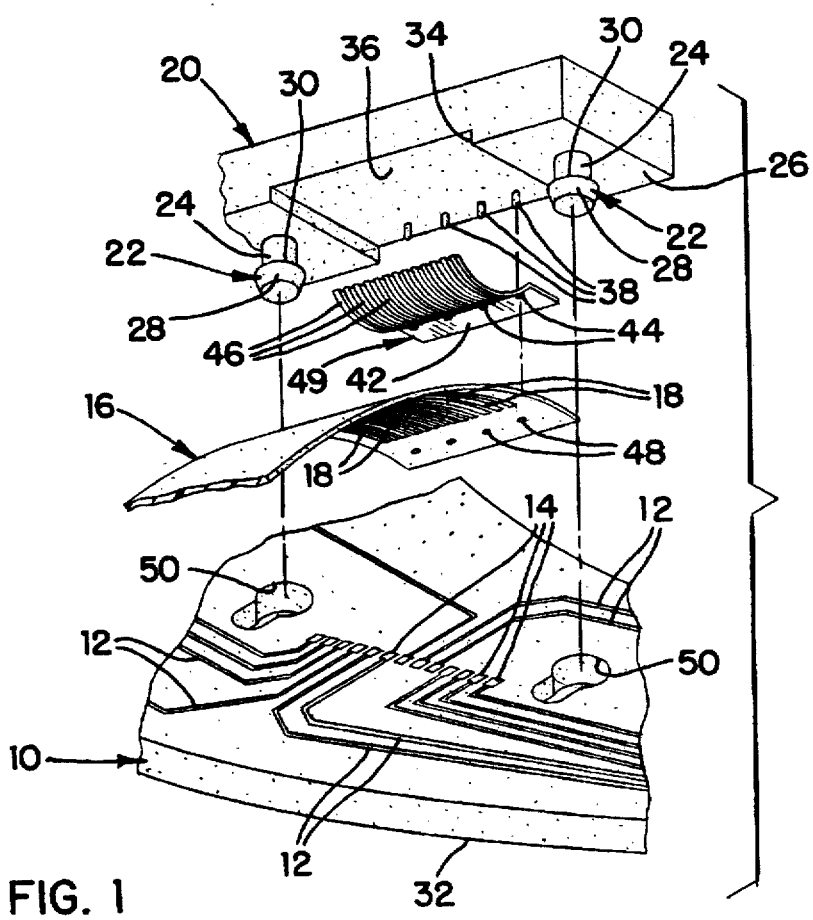
FIG. 1 is an exploded view of a connector system according to the present invention.
Figure 2:
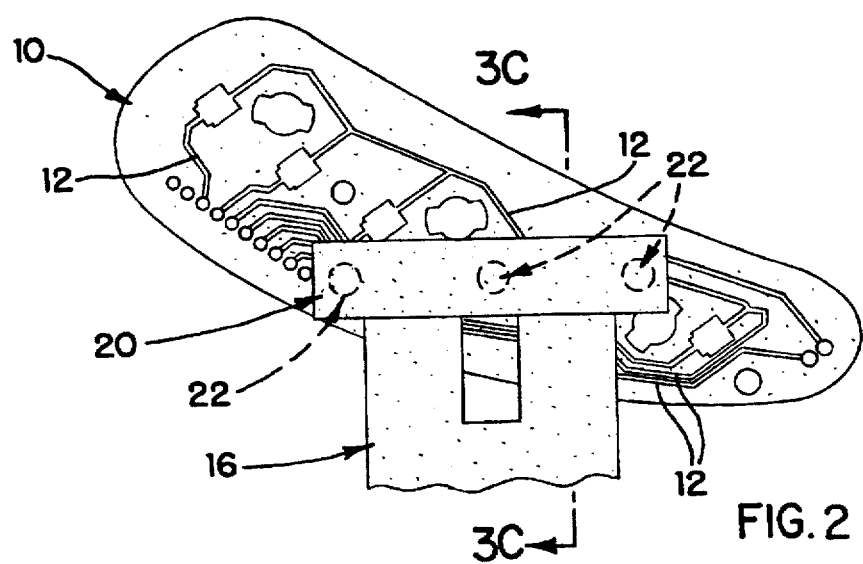
FIG. 2 is a plan view of a connector system according to the present invention.
Figure 3A:
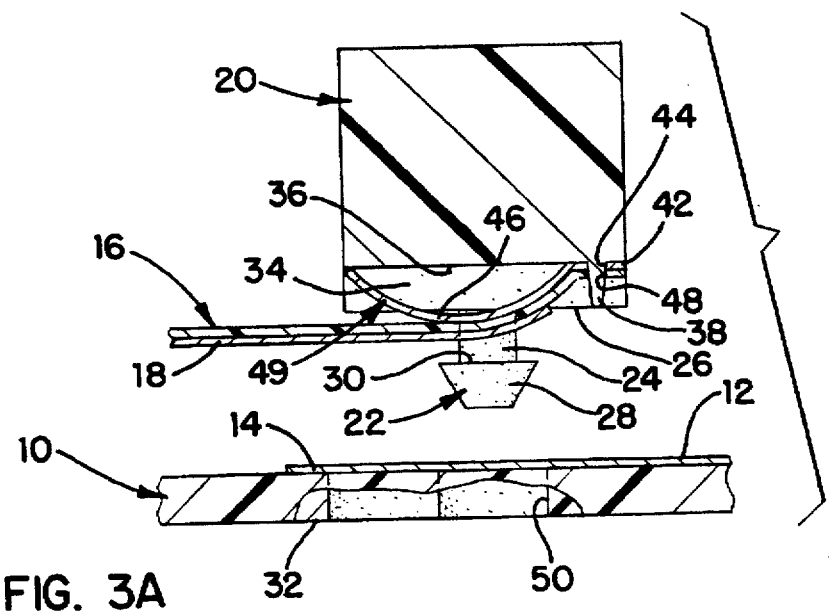
FIGS. 3A–3C are sectional views of a connector system according to the present invention.
Figure 3B:
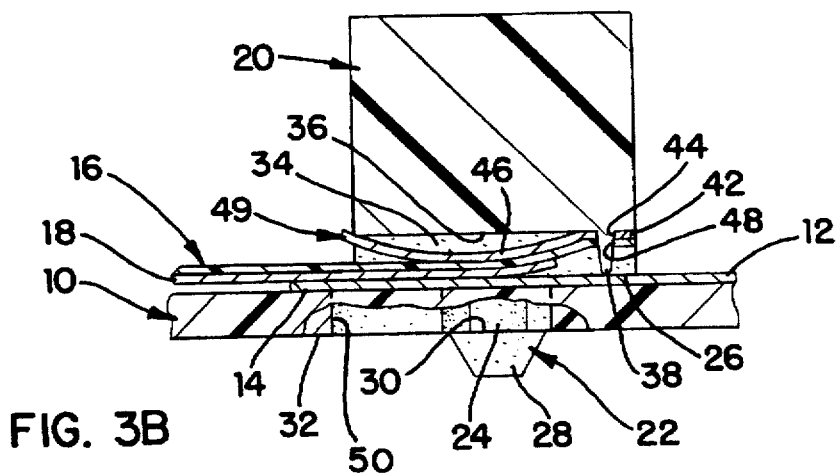
Figure 3C:
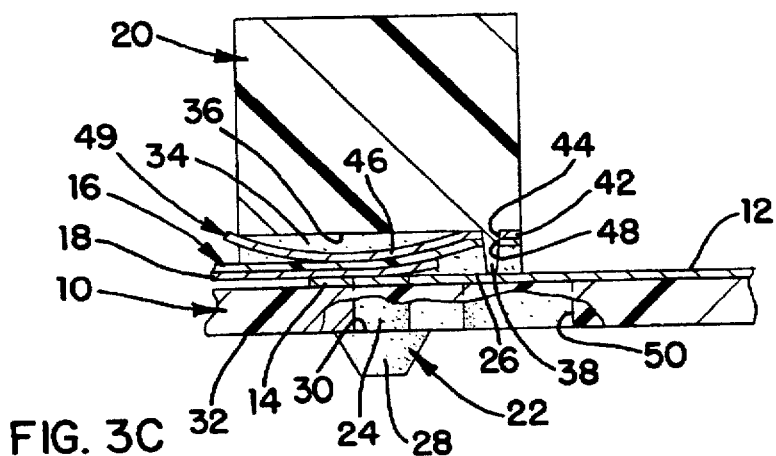

A printed circuit board 10 is provided having electrical traces 12 and electrical contact pads 14 for making connection to a flexible circuit 16. The flexible circuit includes exposed portions of electrical traces 18 for mating with the contact pads on the device. The electrical traces may be the sole means of making contact with the contact pad as opposed to traditional male/female terminals. Although not necessary, raised features may be provided on the flexible circuit and may be made by a variety of methods known to those skilled in the art which may include but are not limited to the methods described in Moulin, U.S. Pat. No. 4,453,795, for a Cable-to-Cable/Component Electrical Pressure Wave Connector Assembly, and U.S. Pat. No. 4,125,310 for an Electrical Connector Assembly Utilizing Wafers for Connecting Electrical Cables, the disclosures of which are both hereby incorporated herein by reference. Alternatively, the raised features may be provided by a mandrel process described in Crumly et al, U.S. Pat. No. 5,207,887, for a Semi-Additive Circuitry with Raised Features Using Formed Mandrels, the disclosure of which is hereby incorporated by reference. Likewise, the raised features may be made simply by mechanically forcing a tool into a contact pad of a flexible circuit to produce the raised feature.

A mounting bar 20 is provided and includes at least two posts 22 extending from a first surface 26 of the mounting bar. Preferably the post includes a body portion 24 extending from the first surface 26 of the mounting bar and a button head 28 having a width greater than the body portion so that a lower surface 30 of the button head frictionally engages a flat surface 32 of the printed circuit board. Preferably the mounting bar 20 includes a recess 34 formed in the first surface 26 and wherein the recess is defined at least in part by a second surface 36 recessed from the first surface 26. Nubs 38 extend from the second surface. A leaf spring 49 is provided having an elongated base 42 section which has a plurality of holes 44 formed therein so that the leaf spring may be frictionally mounted over the hubs 38 on the mounting bar. Preferably the leaf spring has a plurality of spaced apart fingers 46 which extend over the first surface 26 of the mounting bar. A flexible circuit 16 overlies the leaf spring so that the fingers exert a force behind the electrical traces for biasing the exposed portion of electrical traces against the contact pads. The exposed portion of the electrical traces are positioned at the highest point on the leaf spring. Preferably the flexible circuit also includes a plurality of holes 48 formed therein for receiving the nubs 38 and thereby aligning the flexible circuit in proper position.

A slotted through hole 50 is provided in the printed circuit board 10 for receiving the button head 28 of the post through a first substantially round portion and a slotted portion extending therefrom for slidably and frictionally receiving the body portion of the post. The lower surface 30 of the button head also frictionally engages the surface 32 of the circuit board. As the circuit board is slid to a locked position, the contact pads 14 and exposed electrical traces 18 on the flexible circuit are slid against each other thereby removing oxides and other materials that would prevent good electrical contact.

What is claimed is:

1. An assembly comprising:
    a flexible circuit having electrical traces as the sole element for making electrical connection between the flexible circuit and another device,
    a mounting bar having at least two posts extending from a top surface and a plurality of nubs extending upwardly from the top surface,
    a leaf spring having an elongated base portion having a plurality of holes formed therein for frictionally mounting the leaf spring over the nubs on the top surface of the mounting bar, said flexible circuit overlying said leaf spring so that said electrical traces are biased upward by said spring, a printed circuit board having electrical contact pads overlying the flexible circuit and positioned so that the electrical traces are mated with the contact pads on the device, and having a slide locking feature comprising slotted through holes having a slot for each post extending upwardly from the mounting bar for sliding around said post and locking said flexible circuit and said device in a mating relationship.

2. An assembly as set forth in claim 1 wherein said leaf spring comprises a plurality of spaced apart fingers, each finger positioned to engage the underside of the flexible circuit at a location associated with said electrical traces to apply pressure thereto.

3. An assembly as set forth in claim 1 wherein said upwardly extending post comprises a body portion having a first width and button head portion having a second width greater than said first width and said button having a lower engagement surface extending from said body portion for frictionally engaging a top surface on said printed circuit board.

4. An assembly as set forth in claim 1 wherein said flexible circuit includes a plurality of holes formed therein, each hole for receiving one of said hubs and so that said flexible circuit is properly aligned for mating with the contact pad on said device.

5. An assembly as set forth in claim 3 wherein said slotted through hole includes a first hole for receiving the button head and a slot portion for slidably and frictionally receiving the body portion of the post.

* * * * *